(12) United States Patent
Morifuji

(10) Patent No.: US 6,958,520 B2
(45) Date of Patent: Oct. 25, 2005

(54) SEMICONDUCTOR APPARATUS WHICH COMPRISES AT LEAST TWO KINDS OF SEMICONDUCTOR DEVICES OPERABLE BY VOLTAGES OF DIFFERENT VALUES

(75) Inventor: Eiji Morifuji, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/677,858

(22) Filed: Oct. 3, 2003

(65) Prior Publication Data

US 2004/0129997 A1 Jul. 8, 2004

(30) Foreign Application Priority Data

Oct. 4, 2002 (JP) ........................................ 2002-292338

(51) Int. Cl.[7] .............................................. H01L 31/119
(52) U.S. Cl. ...................................... 257/410; 257/411
(58) Field of Search ................................ 257/410, 411

(56) References Cited

U.S. PATENT DOCUMENTS

| | | | | |
|---|---|---|---|---|
| 4,342,149 A | * | 8/1982 | Jacobs et al. ............... | 438/275 |
| 6,538,278 B1 | * | 3/2003 | Chau .......................... | 257/324 |
| 6,696,735 B2 | * | 2/2004 | Fukui ......................... | 257/410 |
| 2003/0151098 A1 | * | 8/2003 | Nishida et al. ............. | 257/369 |
| 2005/0006675 A1 | * | 1/2005 | Tsunashima et al. ........ | 257/288 |

FOREIGN PATENT DOCUMENTS

JP          2002-164439 A          6/2002

* cited by examiner

*Primary Examiner*—Ngân V. Ngô
(74) *Attorney, Agent, or Firm*—Foley & Lardner LLP

(57) ABSTRACT

There is disclosed a semiconductor apparatus comprising a semiconductor substrate having a first region and a second region isolated from the first region, a first semiconductor device which is formed in the first region and which includes a first gate insulating film of a silicon oxide single film formed on the semiconductor substrate, and a first gate electrode formed on the first gate insulating film, and a second semiconductor device which is formed in the second region and which includes a second insulating film of a single layer made of an insulating material of a dielectric constant different from that of the silicon oxide film, and a second gate electrode formed on the second gate insulating film.

5 Claims, 4 Drawing Sheets

SEMICONDUCTOR APPARATUS WHICH COMPRISES AT LEAST TWO KINDS OF SEMICONDUCTOR DEVICES OPERABLE BY VOLTAGES OF DIFFERENT VALUES

CROSS-REFERENCE TO RELATED APPLICATIONS

This application is based upon and claims the benefit of priority from the prior Japanese Patent Application No. 2002-292338, filed Oct. 4, 2002, the entire contents of which are incorporated herein by reference.

BACKGROUND OF THE INVENTION

1. Field of the Invention

The present invention relates to a semiconductor apparatus, and more particularly, to a semiconductor apparatus which comprises at least two kinds of semiconductor devices operable by voltages of different values, i.e., a high voltage and a low voltage, on the same semiconductor substrate, and a method for manufacturing the same.

2. Description of the Related Art

Conventionally, a silicon oxide film which has thermal resistance and enables easy setting of a manufacturing process has widely been used as, e.g., a gate insulating film of a MOS transistor. In recent years, an increased demand for shrinking of a device and higher performance has made a thickness of the gate insulating film smaller and smaller, and there has accordingly been a progress in thinning of the gate insulating film which uses the silicon oxide film. However, if the gate insulating film which uses the silicon oxide film is formed to a certain thickness or lower, a gate leakage current excessively flows, which imposes a limit on thinning.

Thus, as an alternative insulting film, a high dielectric insulating film which uses $Al_2O_3$ or $Zi_2O_5$ higher in dielectric constant than the silicon insulating film as an insulating film material has attracted attention as a thin gate insulating film candidate.

Because of its high dielectric constant compared with the silicon oxide film, such a high dielectric insulating film can defy the limit on thinning of the gate insulating film which uses the silicon oxide film, and assist manufacturing of an integrated semiconductor device including a low voltage system having a thin gate insulating film such as a logic circuit section operated by a low voltage. However, a semiconductor apparatus which handles a low voltage on one hand and a high voltage on the other hand, i.e., two or more circuit sections of different voltages on the same substrate, e.g., a memory section, an I/O section, an analog circuit section or the like of a DRAM-mounted hybrid LSI cannot use the high dielectric film effective for thinning because of presence of the device of a high voltage system to which a high voltage is applied.

Thus, recently, a semiconductor apparatus which has two or more circuit sections of the different voltages has been realized by using the conventional insulating film which uses the silicon oxide film for a semiconductor device of a high voltage system, the insulating film higher in dielectric constant than the silicon oxide film for a semiconductor device of a low voltage system, and forming both on the same substrate.

Now, description will be made of a conventional constitution of the semiconductor apparatus of the aforementioned type and an example of its manufacturing method by referring to FIGS. 4A to 4D.

In FIG. 4A, a silicon oxide film 42 is formed as an insulating film of a high voltage system on the whole surface of a semiconductor substrate 41 which includes a region 43a for forming a high voltage system device and a region 43b for forming a low voltage system device.

Then, as shown in FIG. 4B, the silicon oxide film 42 is selectively etched so as to leave a portion deposited on the region 43a of the semiconductor substrate 41 for forming the high voltage system semiconductor device and to remove a portion deposited on the region 43b for forming the low voltage system semiconductor device, and then a high dielectric insulating film 44 is deposited as a low voltage system insulating film on the whole surface.

Then, as shown in FIG. 4C, a polysilicon film 45 for forming a gate electrode is deposited on the whole surface of the high dielectric insulating film 44 formed on the semiconductor substrate 41. A resist mask is formed on the polysilicon film 45 by using a well-known photolithography method. Patterning and etching are carried out to form gate electrodes 45a, 45b shown in FIG. 4D, gate insulating films 46a, 46b1 of a double layer structure below the gate electrode 45a, and a gate insulating film 46b2 below the gate electrode 45b.

When a semiconductor apparatus is manufactured by using such a conventional method, gate insulating films of a double layer structure which have dielectric constants different from each other, i.e., the silicon oxide film 46a and the high dielectric constant insulating film 46b1, are formed in the region 43a for forming the high voltage system semiconductor device. As a MISFET which has such gate insulating films of a double layer structure, for example, there is a transistor described in Jpn. Pat. Appln. KOKAI Publication No. 2002-164439.

As described above, conventionally, the double layer structure constituted of the silicon oxide film and the high dielectric insulating film has been formed as the gate insulating film of the semiconductor device of the high voltage system.

Thus, because of the formation of the laminated structure of the insulating films having different dielectric constants as the gate insulating film, there have been problems of reductions in performance and reliability of the semiconductor apparatus etc., such as deterioration of mobility caused by level formation on a material interface of the double layers which constitute the gate insulating film, or fluctuation in a threshold value caused by traps formed on the material interface of the double layers by the level formation.

BRIEF SUMMARY OF THE INVENTION

According to a first aspect of the present invention, there is provided a semiconductor apparatus comprising: a semiconductor substrate having a first region and a second region isolated from the first region; a first semiconductor device which is formed in the first region and which includes a first gate insulating film of a silicon oxide single film formed on the semiconductor substrate, and a first gate electrode formed on the first gate insulating film; and a second semiconductor device which is formed in the second region and which includes a second insulating film of a single layer made of an insulating material of a dielectric constant different from that of the silicon oxide film, and a second gate electrode formed on the second gate insulating film.

A second aspect of the present invention provides a method for manufacturing a semiconductor apparatus, comprising: depositing a silicon oxide film on a semiconductor substrate which has a first region and a second region isolated from the first region; removing the silicon oxide film formed on the second region; forming, in the first region, a first semiconductor device which has a first gate insulating film made of the silicon oxide film and a first gate electrode formed on the first gate insulating film; depositing an insulating film of a dielectric constant different from that of the silicon oxide film to cover the first semiconductor device and a surface of the second region from which the silicon oxide film has been removed; and forming, in the second region, a second semiconductor device which has a second gate insulating film formed of the insulating film, and a second gate electrode formed on the second gate insulating film.

According to such a configuration, there is provided a semiconductor apparatus and a method for manufacturing the same which has an excellent performance, a high degree of integration, and first and second semiconductor devices including gate insulating films of a single layer structure having mutually different dielectric constants.

DETAILED DESCRIPTION OF THE INVENTION

Next, various embodiments of the present invention will be described in detail with reference to the accompanying drawings.

(First Embodiment)

Figure 1A:
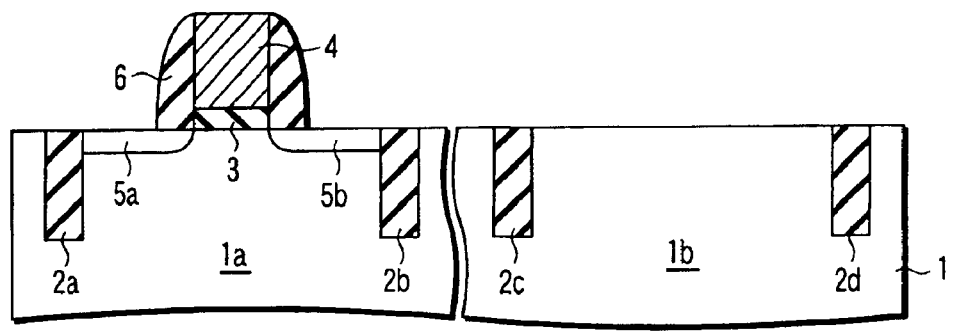
FIG. 1A is a view showing a process of a method for manufacturing a semiconductor apparatus according to a first embodiment of the present invention.
Figure 1B:
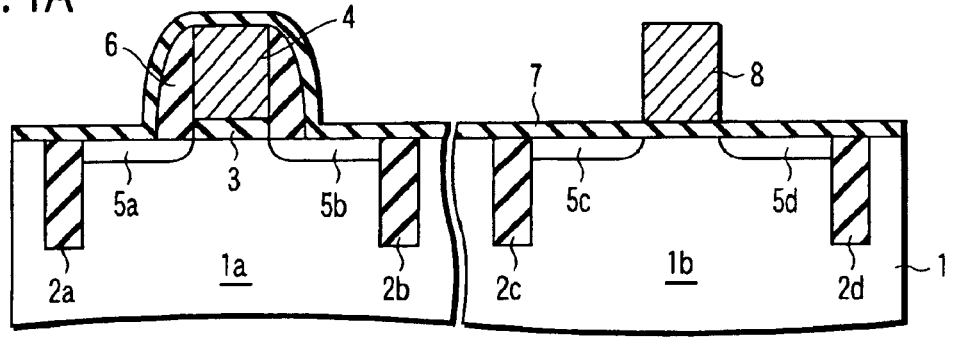
FIG. 1B is a view sequent to FIG. 1A, showing the process of the method for manufacturing the semiconductor apparatus according to the first embodiment of the present invention.
Figure 1C:
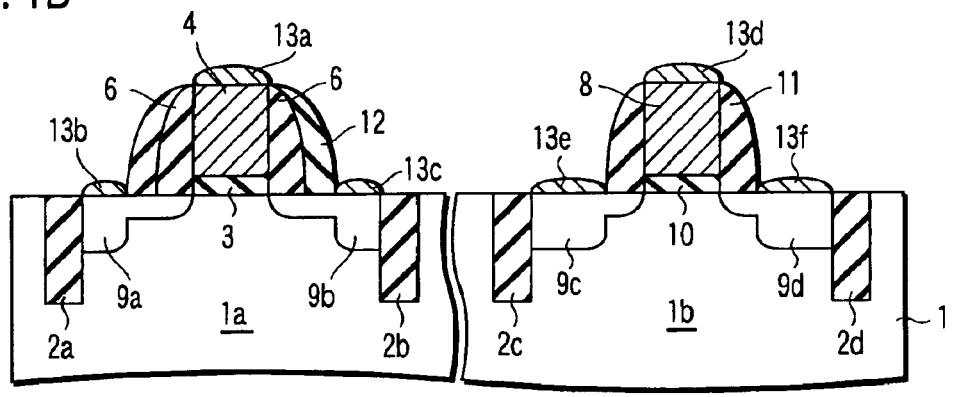
FIG. 1C is a view sequent to FIG. 1B, showing the process of the method for manufacturing the semiconductor apparatus according to the first embodiment of the present invention.
Figure 1D:
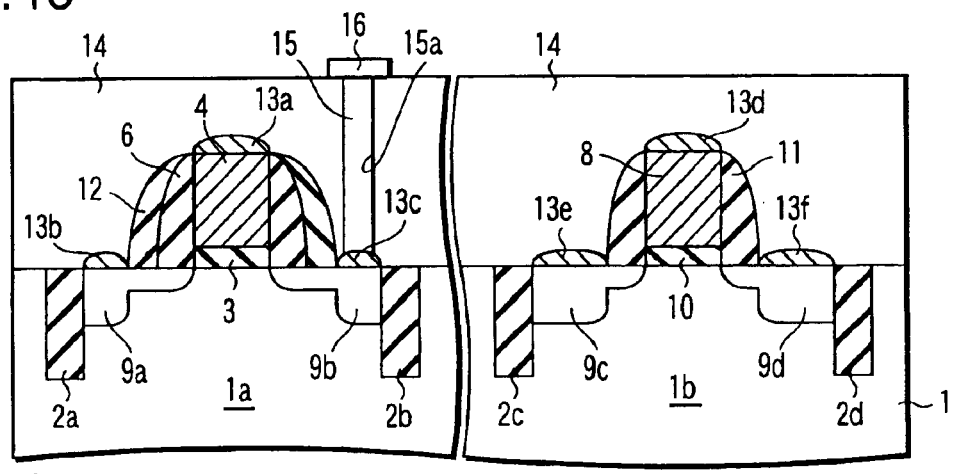
FIG. 1D is a view sequent to FIG. 1C, showing the process of the method for manufacturing the semiconductor apparatus according to the first embodiment of the present invention.

FIG. 1D is a sectional view of a semiconductor apparatus according to a first embodiment of the present invention.

As shown in FIG. 1D, in a first region 1a isolated by device isolation layers 2a, 2b of a semiconductor substrate 1, there is formed a first semiconductor device which comprises a gate insulating film 3 formed on a surface of the semiconductor substrate 1, a gate electrode 4 formed on the gate insulating film 3, a gate side wall insulating film 6 formed on side faces of the gate electrode 4 and gate insulating film 3, a gate side wall insulating film 12 formed outside the gate side wall insulting film 6, a silicide layer 13a formed on an upper surface of the gate electrode 4, source and drain regions 9a, 9b having extensions and diffusively formed in a surface region of the semiconductor substrate 1 to sandwich the gate insulating film 3, silicide layers 13b, 13c formed on surfaces of the source and drain regions 9a, 9b, an interlayer insulating film 14 formed on the whole surface of the semiconductor substrate 1, and a contact plug 15 formed in the contact hole 15a of the interlayer insulating film 14 in a state of being connected to the silicide layer 13c. The contact plug 15 is connected to a metal wiring 16 formed on the interlayer insulating film 14. This first semiconductor device is used as, e.g., a semiconductor device or a MOS transistor to which a high voltage of a DRAM is supplied. It may also be used as a semiconductor device or a MOS transistor to which a high voltage of an I/O circuit, an analog circuit section or the like in an LSI device, for example, is supplied.

On the other hand, in a second region 1b isolated by device isolation layers 2c, 2d of the semiconductor substrate 1, there is formed a second semiconductor device which comprises a gate insulating film 10 formed on the surface of the semiconductor substrate 1, a gate electrode 8 formed on the gate insulating film 10, a gate side wall insulating film 11 formed on side faces of the gate electrode 8 and gate insulating film 10, a silicide layer 13d formed on an upper surface of the gate electrode 8, source and drain regions 9c, 9d having extensions and diffusively formed in the surface region of the semiconductor substrate 1 of both sides of the gate insulating film 10, and silicide layers 13e, 13f formed on surfaces of the source and drain regions 9c, 9d. The second semiconductor device is used as, e.g., a semiconductor device or a MOS transistor in a logic circuit section operated by a low voltage lower than the high voltage.

The gate insulating film 3 of the first semiconductor device is made of, as a high voltage system material, silicon dioxide which is a silicon oxide film, and a film thickness is normally 2.5 nm to 6 nm, for example. The gate insulating film 10 of the second semiconductor device is constituted of, as a low voltage system gate insulating film which has a high dielectric constant and can reduce a gate leakage current. The gate insulating film 10 is formed of, e.g., a silicon nitride film, a hafnium oxide film, a zirconium oxide film, a silicate film or the like, and a film thickness is normally 1 nm to 2 nm, for example.

The gate electrodes 4 and 8 are both made of polysilicon materials, and the gate side walls 6, 11, 12 are made of silicon nitride films or silicon oxide films.

Hereinafter, an example of the method for manufacturing the semiconductor apparatus of the first embodiment shown in FIG. 1D will be described by referring to FIGS. 1A to 1D.

As shown in FIG. 1A, first, the device isolation layers 2a, 2b are formed on the silicon semiconductor substrate 1 to constitute the first semiconductor device of a high voltage system in the region 1a. Simultaneously, the device isolation layers 2c, 2d are formed to constitute the second semiconductor device of a low voltage system in the region 1b. The device isolation layers 2a to 2d can be formed by, e.g., a normal shallow trench isolation (STI) method.

Then, a silicon oxide film is formed on the whole surface of the semiconductor substrate 1 to form the gate insulating film 3 of the high voltage system semiconductor device.

Then, a polysilicon film is deposited to form the gate electrode 4 on the formed silicon oxide film 3. Then, gate processing is carried out by a normal photolithography method to form the gate insulating film 3 and the gate electrode 4 in the first region 1a.

Subsequently, in a state in which the second region 1b to form the semiconductor device of the low voltage system is covered with, e.g., a resist film, by using the gate oxide film 3 and the gate electrode 4 as masks, predetermined conductivity-type impurities are doped shallowly between the gate oxide film 3 and the device isolation layers 2a, 2b of the first region 1a by, e.g., an ion implantation method, whereby LDD layers or extensions 5a, 5b of the high voltage system semiconductor device are formed.

Then, a silicon nitride film, for example, is deposited on the whole surface of the semiconductor substrate 1, and etching is subsequently carried out to form the gate side wall insulating film 6 on the side faces of the gate oxide film 3 and the gate electrode 4. A silicon oxide film may be used in place of the silicon nitride film.

As a result, as shown in FIG. 1A, the first semiconductor device is formed in the first region 1a, which includes the gate insulating film 3 of a silicon oxide single film, the gate electrode 4 formed on the gate insulating film 3, and the gate side wall insulating film 6.

Then, as shown in FIG. 1B, in order to form the gate insulating film 10 of the low voltage system semiconductor device in the second region 1b (see FIG. 1C), a high dielectric insulating material, e.g., a silicon nitride film 7, is deposited on the whole surface of the semiconductor substrate 1.

Then, a polysilicon film is deposited in order to form the gate electrode 8 on the silicon nitride film 7, and gate processing is carried out by a normal photolithography method to form the gate electrode 8 in the second region 1b.

Subsequently, in a state in which the first region 1a is covered with, e.g., a resist film, by using the gate electrode 8 as a mask, predetermined conductivity-type impurities are doped shallowly between the gate electrode 8 and the device isolation layers 2c, 2d of the second region 1b by, e.g., an ion implantation method, whereby extensions or LDD layers 5c, 5d of the low voltage system semiconductor device are formed. This state is shown in FIG. 1B.

Then, as shown in FIG. 1C, by using the gate electrode 8 as a mask, the silicon nitride film 7 is etched by a normal photolithography method to form the gate insulating film 10 only below the gate electrode 8.

Then, for example, a silicon nitride film is deposited on the whole surface of the semiconductor substrate 1, and etching is subsequently carried out to form the gate side wall insulating film 11 on the side portions of the gate insulating film 10 and the gate electrode 8 of the second region 1b. Simultaneously, the gate side wall insulating film 12 made of the same material as that of the gate side wall insulating film 11 is formed in the first semiconductor device of the first region 1a. The gate side wall insulating films 11, 12 may be formed by using a silicon oxide film in place of the silicon nitride film.

In this state, in alignment with ends of the gate side wall insulating films 11 and 12, ion implantation is carried out by using predetermined impurities having the same conductivity-type as the LDD layers 5a to 5d, respectively, but higher in concentration. The impurities are injected more deeply than the LDD layers 5a to 5d between the gate side wall insulating film 12 and the device isolation layers 2a, 2b of the first region 1a and between the gate side wall insulating film 11 and the device isolation layers 2c, 2d of the second region 1b by, e.g., an ion implantation method, whereby the source and drain regions 9a, 9b (high voltage system) of the semiconductor device having the LDD regions, and the source and drain regions 9c, 9d (low voltage system) having the LDD regions are formed, respectively.

Then, normal formation of a silicide layer is carried out on the whole surface of the semiconductor substrate 1 and a normal etching method is carried out to leave the silicide layers 13a, 13d on the gate electrodes 4, 8, the silicide layers 13b, 13c on the source and drain regions 9a, 9b, and silicide layers 13e, 13f on the source and drain regions 9c, 9d. These silicide layers are conductive layers to serve as chemical barrier layers.

As a result, different from the conventional case, a double layer structure of a gate insulating film made of insulating materials of dielectric constants different from each other is not formed, and a semiconductor apparatus can be achieved, which has a first semiconductor device including the single layer high voltage system gate insulating film 3 and the gate electrode 4, and a second semiconductor device including the low voltage system gate insulating film 10 higher in dielectric constant than the single gate layer 3 of the high voltage system and the gate electrode 8 on the same semiconductor substrate 1.

In the described process, the gate side wall insulating film 12 is deposited on the gate side wall insulting film 6, to form a double layer structure of the gate side wall insulating film 6 and the gate side wall insulating film 12 on the side portions of the gate insulating film 3 and the gate electrode 4.

Thus, in the first, second semiconductor devices formed in the first and second regions 1a, 1b, if the gate side wall insulating films are formed by using different materials, a double layer structure of the gate side wall of different insulating materials is formed only in the first semiconductor device.

If the same side wall material is used for the double layer structure, a one-layer structure is practically formed since the double layer structure of the gate side insulating film made of the same material is formed in the first semiconductor device. However, the double-layered film structure is formed by two different processes, and a layer interface is formed on a boundary between first and second layer by chemical reaction. Thus, formation of the double layer structure of the gate side walls can be verified.

Then, as shown in FIG. 1D, an insulating material is deposited on the whole surface of the semiconductor substrate 1 to form the interlayer insulating film 14. In this interlayer insulating film 14, a contact hole 15a is formed between the semiconductor substrate 1 and a surface of the interlayer insulating film 14. This contact hole 15a is formed by using a normal photolithography method and etching the interlayer insulating film 14 up to the silicide layer 13c formed on the diffused region 9b to form a contact plug 15. A conductive substance, e.g., tungsten, is deposited in the contact hole 15a to form the contact plug 15. Then, the metal wiring 16 is formed on the surface of the interlayer film 14 to be connected to the contact plug 15.

According to the embodiment shown in FIG. 1D, the source and drain regions 9a, 9b, and the source and drain regions 9c, 9d all have LDD layers which are shallow diffusion regions. However, the regions can be similarly implemented as source and drain regions which have no LDD or extension layers.

(Second Embodiment)

Figure 2A:
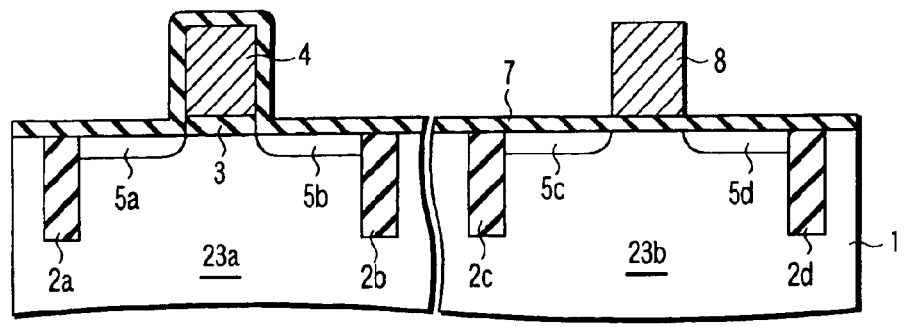
FIG. 2A is a view showing a process of a method for manufacturing a semiconductor apparatus according to a second embodiment of the present invention.
Figure 2B:
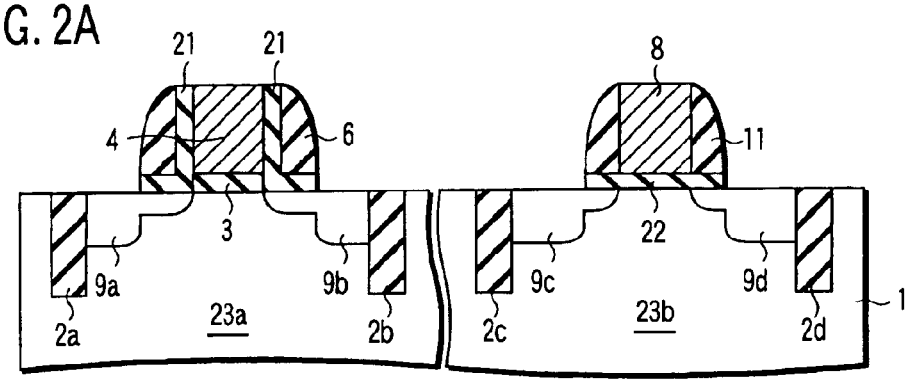
FIG. 2B is a view sequent to FIG. 2A, showing the process of the method for manufacturing the semiconductor apparatus according to the second embodiment of the present invention.
Figure 2C:
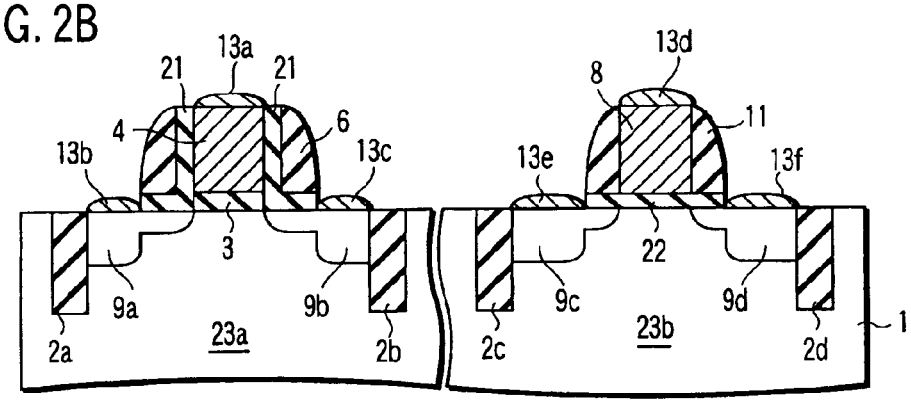
FIG. 2C is a view sequent to FIG. 2B, showing the process of the method for manufacturing the semiconductor apparatus according to the second embodiment of the present invention.
Figure 2D:
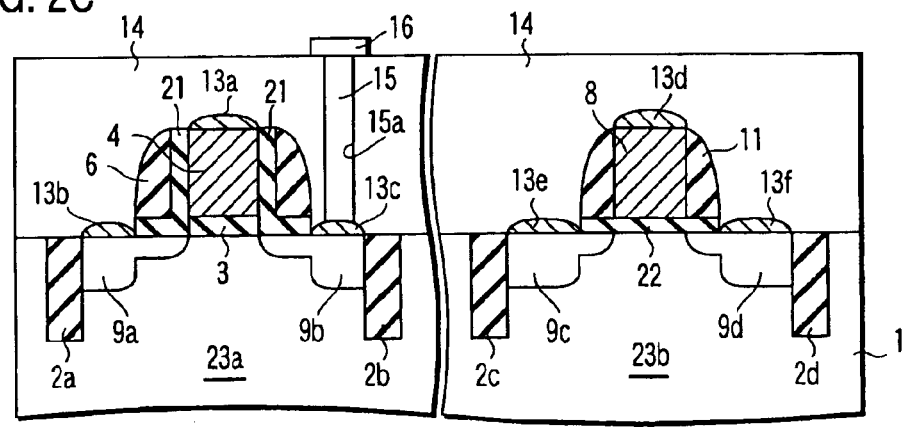
FIG. 2D is a view sequent to FIG. 2C, showing the process of the method for manufacturing the semiconductor apparatus according to the second embodiment of the present invention.

FIG. 2D is a sectional view of a semiconductor apparatus according to a second embodiment of the present invention. In the description below, portions similar to those of FIGS. 1A to 1D are denoted by similar reference numerals, and explanation thereof will be omitted.

As shown in FIG. 2D, in a first region 23a isolated by device isolation layers 2a, 2b of a semiconductor substrate 1, there is formed a first semiconductor device which comprises a gate insulating film 3 formed on a surface of the semiconductor substrate 1, a gate electrode 4 formed on the gate insulating film 3, a high dielectric insulating film 21 formed to cover the gate insulating film 3 and the gate electrode 4, a gate side wall insulating film 6 formed on a side wall of the high dielectric insulating film 21 corresponding to a side face of the gate electrode 4, source and drain regions 9a, 9b which have an LDD or extension structure and which are formed in a surface region of the semiconductor substrate 1 between the gate insulating film 3 and the device isolation layers 2a, 2b, silicide layers 13b, 13c formed on surfaces of the source and drain regions 9a, 9b, an interlayer insulating film 14 formed to cover the whole surface of the semiconductor substrate 1, a contact plug 15 which is formed in the contact hole 15a in the interlayer insulating film 14 and which lower end is connected to the silicide layer 13c, and a metal wiring 16 formed on a surface of the interlayer insulating film 14 to be connected to the contact 15.

On the other hand, in a second region 23b isolated by device isolation layers 2c, 2d of the semiconductor substrate 1, there is formed a second semiconductor device which comprises a gate insulating film 22 formed on the surface of the semiconductor substrate 1, a gate electrode 8 formed on the gate insulating film 22, a gate side wall 11 formed on a side face of the gate electrode 8 on the gate insulating film 22, a silicide layer 13d formed on an upper surface of the gate electrode 8, source and drain regions 9c, 9d formed in the surface region of the semiconductor substrate 1 between the gate insulating film 22 and the device isolation layers 2c, 2d, silicide layers 13e, 13f formed on the source and drain regions 9c, 9d, and an interlayer insulating film 14 to cover the whole surface of the semiconductor substrate 1.

A feature of the embodiment is that in the second region 23b, the gate electrode 8 and the side wall insulating film 11 are mounted on the gate insulating film 22. Additionally, in the first region 23a, the high dielectric film 21 made of the same high dielectric insulating material as that of the gate insulating film 22 is formed to cover the side surfaces of the gate insulating film 3 and the gate electrode 4.

Hereinafter, an example of the method for manufacturing the semiconductor apparatus of the second embodiment shown in FIG. 2D will be described by referring to FIGS. 2A to 2D.

As shown in FIG. 2A, first, the device isolation layers 2a, 2b are formed on the silicon semiconductor substrate 1 to constitute the first semiconductor device of a high voltage system in the first region 23a. Simultaneously, the device isolation layers 2c, 2d are formed to constitute the second semiconductor device of a low voltage system in the second region 23b. The device isolation layers 2a to 2d can be formed by, e.g., a normal shallow trench isolation (STI) method.

Then, a silicon oxide film is formed on the whole surface of the semiconductor substrate 1 to form the gate insulating film 3 of the high voltage system semiconductor device.

Then, a polysilicon film is deposited to form the gate electrode 4 on the formed silicon oxide film for the gate insulating film 3, and gate processing is carried out by a normal photolithography method to form the gate insulating film 3 and the gate electrode 4 in the first region 23a.

Subsequently, in a state in which the second region 23b to form the semiconductor device of the low voltage system is covered with, e.g., a resist film, by using the gate oxide film 3 and the gate electrode 4 as masks, predetermined conductivity-type impurities are doped shallowly between the gate oxide film 3 and the device isolation layers 2a, 2b of the first region 23a by, e.g., an ion implantation method, whereby extension or LDD layers 5a, 5b of the high voltage system semiconductor device are formed.

Then, in order to form the gate insulating film 22 of the low voltage system semiconductor device (see FIG. 2C), a silicon dioxide film 7 of a high dielectric material is deposited on the whole surface of the semiconductor substrate 1. Then, a polysilicon film is deposited in order to form the gate electrode 8 on the silicon dioxide film 7, and gate processing is carried out by a normal photolithography method to form the gate electrode 8 in the second region 23b.

Subsequently, in a state in which the region 23a to form the semiconductor device of a high voltage system is covered with, e.g., a resist film (not shown), by using the gate electrode 8 as a mask, predetermined conductivity-type impurities are doped shallowly between the gate electrode 8 and the device isolation layers 2c, 2d of the second region 23b by, e.g., an ion implantation method, whereby extension or LDD layers 5c, 5d of the low voltage system semiconductor device are formed.

Then, as shown in FIG. 2B, a silicon nitride film is deposited on the whole surface of the semiconductor substrate 1, and etching is subsequently carried out to form the gate side wall insulating film 6 on a portion corresponding to the side face of the gate electrode 4 on a side portion of the high dielectric insulating film 7 formed to cover the gate insulating film 3 and the gate electrode 4 in the first semiconductor device. Simultaneously, the gate side wall insulating film 11 is formed on the side portions of the high dielectric insulating film 7 and the gate electrode 8 in the second semiconductor device.

Thus, according to the embodiment, since the gate side wall insulating films 6 and 11 of the semiconductor devices of both regions 23a, 23b can be formed by one operation, it is possible to reduce the manufacturing steps, compared with those of the first embodiment.

Further, in the first semiconductor device and the second semiconductor device, by using a normal photolithography, the high dielectric film 7 not covered with the gate electrodes 4, 8 and the gate side wall insulating films 6, 11 on the semiconductor substrate 1 is removed by etching.

In this state, in alignment with the side portions of the gate side wall insulating film 6 and the side wall insulating film 11, by using the gate electrodes 4, 8 and the gate side wall insulating films 6, 11 as masks, the same impurities of high concentration as those of the LDD layers 5a to 5d, respectively, are doped more deeply between the high dielectric film 21 and the device isolation layers 2a, 2b of the first region 23a and between the gate insulating film 22 and the device isolation layers 2c, 2d of the second region 23b by, e.g., an ion implantation method, whereby the source and drain regions 9a, 9b (high voltage system) and the source and drain regions 9c, 9d (low voltage system) of the semiconductor devices are formed.

Then, as shown in FIG. 2C, formation of a silicide layer is carried out for the whole surface of the semiconductor substrate and etching is performed to form the silicide layers 13b, 13c on the source and drain regions 9a, 9b, the silicide layer 13d on the upper surface of the gate electrode 8, and the silicide layers 13e, 13f on the source and drain regions 9c, 9d, respectively.

Then, as shown in FIG. 2D, an insulating material is deposited on the whole surface of the semiconductor substrate 1 to form the interlayer insulating film 14. In this interlayer insulating film 14, a contact hole 15a is formed to connect the source/drain region 9b formed on the semiconductor substrate 1 with the metal wiring 16 to be formed on the surface of the interlayer film 14. This contact hole 15a is formed by using a normal photolithography method and etching the interlayer insulating film 14 up to the silicide layer 13c formed on the source-drain region 9b to form the contact plug 15. Then, a conductive substance, e.g., tungsten, is deposited in the contact hole 15a to form the contact plug 15. Then, the metal wiring 16 is formed.

As a result, the semiconductor apparatus can be achieved, which comprises, on the same semiconductor substrate 1, the first semiconductor device having the gate electrode 4 formed on the gate insulating film 3 of the silicon oxide film as the high voltage system insulating film of the single layer, and the second semiconductor device having the gate electrode 8 formed on the low voltage system insulating film of the single layer.

The structure which has the first semiconductor device of the single gate insulation layer and the second semiconductor device of the single gate insulation layer on the same semiconductor substrate can provide effects similar to those of the first embodiment.

According to the second embodiment, since the high dielectric insulating film 7 of the high voltage system is deposited immediately after the gate electrode 4 is formed, the structure is employed in which the high voltage system semiconductor device formed in the first region 23a has the high dielectric gate side insulating film 21 to cover the side surfaces of the gate insulating film 3 and the gate electrode 4.

In the second region 23b, after the high dielectric insulating film 7 is deposited followed by the formation of the gate electrode 8, the side wall insulating film is deposited without etching the high dielectric insulating film 7. Thus, there is a gate insulating film 22 between the gate electrode 8, the gate side wall insulating film 11 and the semiconductor substrate 1.

For film thicknesses and materials of the high voltage system insulating film and the low voltage system insulating film, the substrate and the electrodes similar to those of the first embodiment can be used.

(Third Embodiment)

Figure 3A:
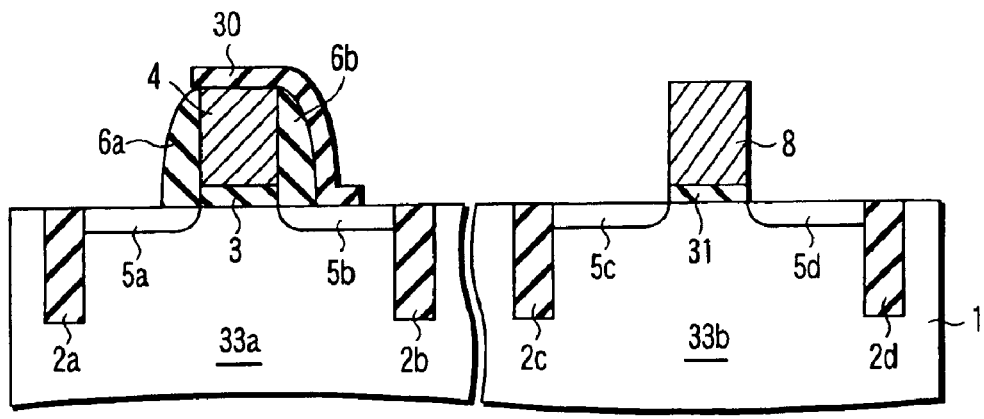
FIG. 3A is a view showing a process of a method for manufacturing a semiconductor apparatus which includes an etching stopper insulating film according to a third embodiment of the present invention.
Figure 3B:
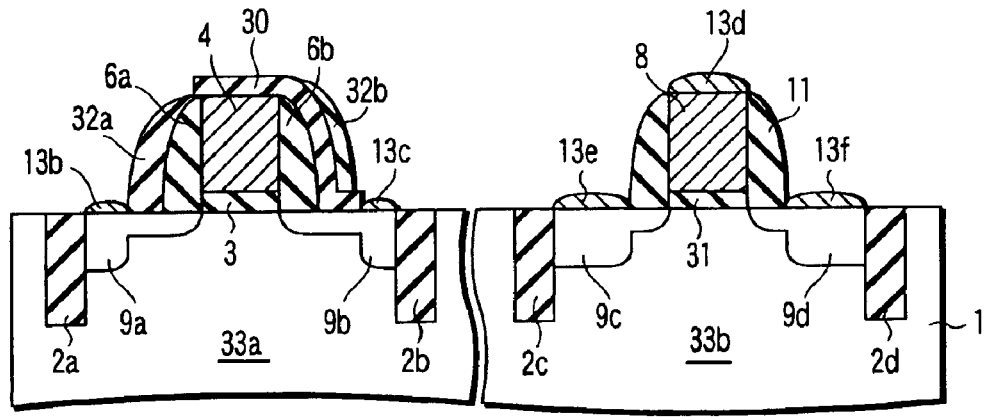
FIG. 3B is a view sequent to FIG. 3A, showing the process of the method for manufacturing the semiconductor apparatus which includes the etching stopper insulating film according to the third embodiment of the present invention.
Figure 3C:
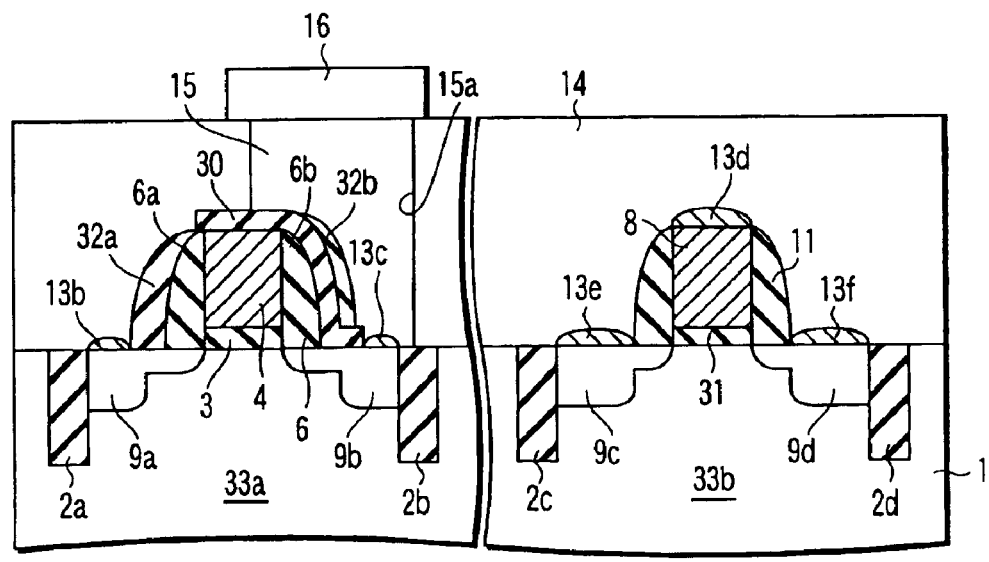
FIG. 3C is a view sequent to FIG. 3B, showing the process of the method for manufacturing the semiconductor apparatus which includes the etching stopper insulating film according to the third embodiment of the present invention.
Figure 4A:
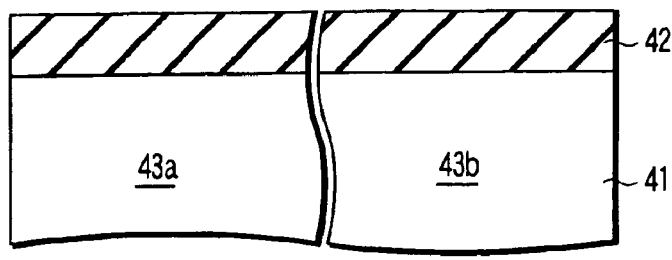
FIG. 4A is a view showing a process of a conventional method for manufacturing a semiconductor apparatus.
Figure 4B:
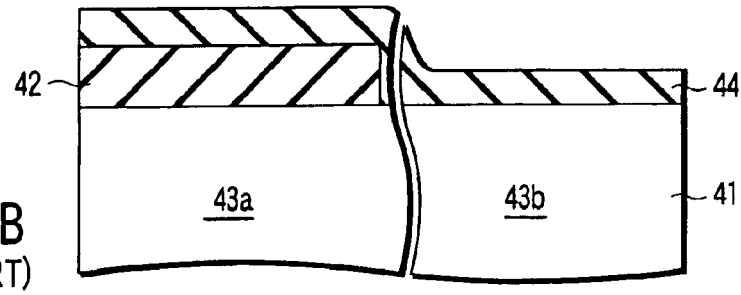
FIG. 4B is a view sequent to FIG. 4A, showing the process of the conventional method for manufacturing the semiconductor apparatus.
Figure 4C:
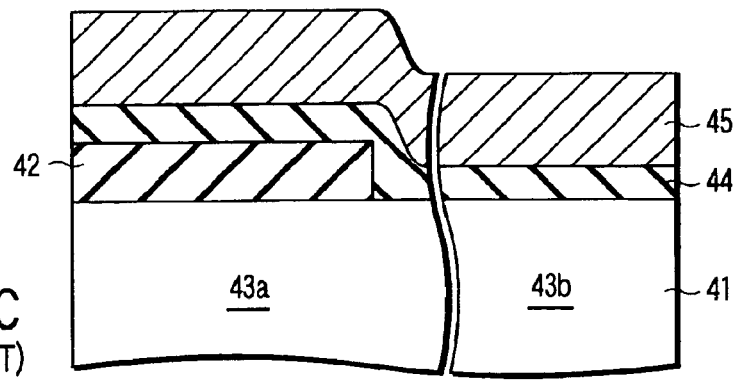
FIG. 4C is a view sequent to FIG. 4B, showing the process of the conventional method for manufacturing the semiconductor apparatus.
Figure 4D:
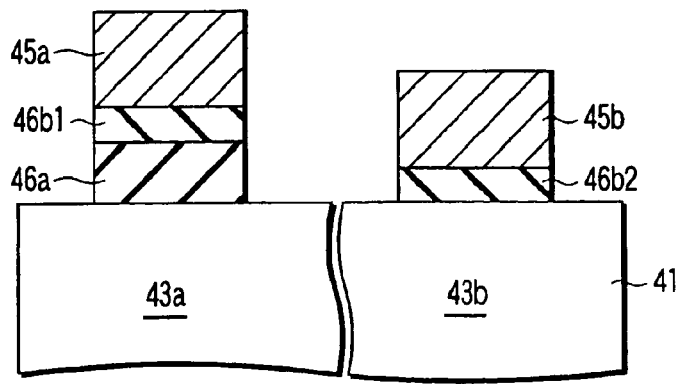
FIG. 4D is a view sequent to FIG. 4C, showing the process of the conventional method for manufacturing the semiconductor apparatus.

FIG. 3C is a sectional view of a semiconductor apparatus according to a third embodiment of the present invention. In the embodiment, portions similar to those of FIGS. 1A to 1D or FIGS. 2A to 2D are denoted by similar reference numerals, and detailed description thereof will be omitted.

As shown in FIG. 3C, in a first region 33a isolated by device isolation layers 2a, 2b of a semiconductor substrate 1, there is formed a semiconductor device of a high voltage system which comprises a gate insulating film 3 formed on a surface of the semiconductor substrate 1, a gate electrode 4 formed on the gate insulating film 3, gate side wall insulating films 6a, 6b as a gate side wall insulation layer 6 formed on a side face of the gate electrode 4, an etching stopper film 30 to cover the upper surface of the gate electrode 4 and parts of surfaces of one gate side wall insulating film 6b and the semiconductor substrate 1, a gate side wall insulating film 32a formed on the gate side wall insulating film 6a, a gate side wall insulating film 32b formed on a portion of the etching stopper film 30 corresponding to the gate side wall insulating film 6b, source and drain regions 9a, 9b which have extensions or LDD layers formed in a surface region of the semiconductor substrate 1 between the gate insulating film 3 and the surface isolation layers 2a, 2b, silicide layers 13b, 13c formed on surfaces of the source and drain regions 9a, 9b, an interlayer insulating film 14 formed on the surface of the semiconductor substrate 1, a contact plug 15 which is formed in the contact hole 15a formed in the interlayer insulating film 14 and which lower end is connected through the silicide layer 13c to the source/drain region 9b, and a metal wiring 16 formed on a surface of the interlayer insulating film 14 to be connected to the contact plug 15.

In a second region 33b isolated by device isolation layers 2c, 2d, there is formed a semiconductor device of a low voltage system which comprises a gate insulating film 31 formed on the semiconductor substrate 1, a gate electrode 8 formed on the gate insulating film 31, a gate side wall insulating film 11 formed on side faces of the gate electrode 8 and the gate insulating film 31, a silicide layer 13d formed on an upper surface of the gate electrode 8, source and drain regions 9c, 9d having extensions and formed in the surface region of the semiconductor substrate 1 between the gate insulating film 31 and the device isolation layers 2c, 2d, silicide layers 13e, 13f formed on the source and drain regions 9c, 9d, and the interlayer insulating film 14 formed on the surface of the semiconductor substrate 1.

A feature of the embodiment is that the etching stopper film 30 is formed in the first region 33a, and the contact plug 15 is formed on the etching stopper film 30 at least in a state of being connected to the silicide layer 13c. As described later, the etching stopper film 30 is a part of a high dielectric film deposited on the surface of the semiconductor substrate 1 when the low voltage system gate insulating film 31 is formed.

Hereinafter, an example of the method for manufacturing the semiconductor apparatus of the third embodiment shown in FIG. 3C will be described by referring to FIGS. 3A to 3C.

First, before the start of the manufacturing step shown in FIG. 3A, a structure similar to that of the first embodiment shown in FIG. 1A is formed. However, the first region 1*a*, the second region 1*b* shown in FIG. 1A are denoted by reference numerals 33*a*, 33*b* in FIG. 3A.

Then, in the first region 33*a*, in order to form the etching stopper film 30 shown in FIG. 3A by etching the high dielectric insulating film 7 shown in FIG. 1A, etching is carried out by covering the gate electrode 4, and at least parts of the upper portions of one side wall insulating film 6*b* and the semiconductor substrate 1 with a mask on the first semiconductor device corresponding to the etching stopper film 30.

On the other hand, in the second region 33*b*, by using the gate electrode 8 as a mask, the high dielectric insulating film 7 is etched to leave the gate insulating film 31 only below the gate electrode 8.

That is, according to the embodiment, as shown in FIG. 3A, the etching stopper film 30 of the first region 33*a* and the insulating film 31 of the second region 33*b* are simultaneously formed from the high dielectric insulating film 7 of FIG. 1B.

Thus, conventionally, the step of depositing the etching stopper insulating film has separately been carried out to form the contact in a self-alignment manner. However, according to the embodiment, since the etching stopper film can be formed at the same time when the gate insulating film 31 is deposited, the conventional separate deposition step of the etching stopper insulating film can be omitted.

Then, as shown in FIG. 3B, for example, a silicon nitride film is deposited on the surface of the semiconductor substrate 1, and etching is subsequently carried out to form the gate side wall insulating film 11 on the side portions of the gate insulating film 31 and the gate electrode 8 of the second region 33*b*. Simultaneously, gate side wall insulating films 32*a*, 32*b* made of the same material as that of the gate side wall insulating film 11 are formed on the gate side wall insulating film 6*a* and the etching stopper film 30 of the first semiconductor device of the first region 33*a*. Here, a silicon oxide film may be used in place of the silicon nitride film.

In this state, in alignment with the gate side wall insulating film 11, the gate side wall insulating films 32*a*, 32*b*, and the etching stopper film 30, impurity ion implantation is carried out. The same conductivity-type impurities as those of the LDD layers 5*a* to 5*d* are doped more deeply at higher concentration between the gate side wall insulating film 32*a* and the device isolation layer 2*a* of the first region 33*a* and between the gate side wall insulating film 11 and the device isolation layers 2*c*, 2*d* of the second region 33*b*, whereby the source and drain regions 9*a*, 9*b* (high voltage system) and the source and drain regions 9*c*, 9*d* (low voltage system) of the semiconductor devices which have extension or LDD structures are formed.

Then, as in the case of the previous embodiments, normal formation of a silicide layer is carried out. The silicide layers 13*b*, 13*c* are formed on the source and drain regions 9*a*, 9*b*, the silicide layers 13*e*, 13*f* are formed on the source and drain regions 9*c*, 9*d*, and the silicide layer 13*d* is formed on the top surface of the gate electrode 8.

Then, as shown in FIG. 3C, an insulating material is deposited on the surface of the semiconductor substrate 1 to form the interlayer insulating film 14. Then, the contact hole 15*a* is formed in a position corresponding to the source/drain region 9*b* of the interlayer insulating film 14. This contact hole 15*a* is formed in the interlayer insulating film 14 by using a normal photolithography method and etching the interlayer insulating film 14 to expose the silicide layer 13*c*. Then, a conductive substance, e.g., tungsten, is deposited in the formed contact hole 15*a* to form the contact plug 15. The contract plug 15 is connected to the metal wiring 16 formed on the interlayer insulating film 14.

According to the embodiment, the conventional formation of the double structure of the gate insulating films of insulating materials of different dielectric constants can be eliminated, and the semiconductor apparatus can be achieved, which comprises, on the same semiconductor substrate 1, the first semiconductor device including the high voltage system gate insulating film of the single layer and the gate electrode 4, and the second semiconductor device including the low voltage system gate insulating film of a dielectric constant higher than that of the high voltage system of the single layer, and the gate electrode 8.

In the process shown in FIGS. 3A to 3C, since the gate side wall insulating films 32*a*, 32*b* are further formed on the gate side wall insulating films 6*a*, 6*b*, a double layer structure of the gate side wall insulating film 6*a* and the side wall insulating film 32*a* is formed on the portion of the source/drain region 9*a* in which the etching stopper insulating film 30 is not present, on the side portions of the gate insulating film 3 and the gate electrode 4.

Thus, if different side wall materials are used for the side wall insulating films 6*a*, 32*a*, a double layer structure of gate side walls of different insulating materials is formed in the first MOS semiconductor device. In an actual product, it can be easily verified that the gate side wall insulating films have such a double layer structure.

Even if the same side wall material is used for the double layer structure, since this double layer structure is formed by a different process, a chemical or physical boundary surface is formed on the connection surface of the two layers. Thus, the formation of the double layer structure of the gate side walls can be verified relatively easily, which is similar to the first embodiment.

The etching stopper insulating film 30 is made of the same material as that of the gate insulating film 31, which is different from that of the interlayer insulating film 14 to be subsequently deposited. Accordingly, when the interlayer insulating film 14 is etched to form the contact hole 15*a*, etching of the etching stopper insulating film 30 is easily blocked by selective etching, and contact between the gate electrode 4 and the contact plug 15 can be prevented in the manufacturing process.

Further, for the formation of the contact plug 15, since the contact plug 15 can be formed in self-alignment by using the etching stopper film 30, an integration degree of the semiconductor apparatus can be increased.

Film thicknesses and materials used for the gate insulating film, the gate electrode and the gate side wall insulating film are similar to those of the second embodiment, and thus description thereof will be omitted.

As described above, according to the present invention, it is possible to achieve the semiconductor apparatus which includes, on the same semiconductor substrate, the semiconductor device having the silicon oxide film as the high voltage system gate insulating film of the single layer, and the semiconductor device having the high dielectric low voltage system gate insulating film of the single layer. Thus, it is possible to provide a reliable semiconductor apparatus in which semiconductor devices having single layer gate insulating films, voltages of different levels being supplied thereto, are formed in a mixed manner on the same semiconductor substrate.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general invention concept as defined by the appended claims and their equivalents.

What is claimed is:

1. A semiconductor apparatus comprising:
a semiconductor substrate having a first region and a second region isolated from the first region;
a first semiconductor device which is formed in the first region and which includes a first gate insulating film of a silicon oxide single film formed on the semiconductor substrate, and a first gate electrode formed on the first gate insulating film; and
a second semiconductor device which is formed in the second region and which includes a second gate insulating film of a single layer made of an insulating material of a dielectric constant different from that of the silicon oxide film, and a second gate electrode formed on the second gate insulating film;
the semiconductor apparatus further comprising a first gate side wall insulating film formed on a side wall of the first gate electrode, and a second gate side wall insulating film formed on a side wall of the second gate electrode, wherein the first semiconductor device has an etching stopper film which is made of the same insulating material as that of the second gate insulating film and which covers the whole upper surface of the first gate electrode and at least a part of the first gate side wall insulating film.

2. The semiconductor apparatus according to claim 1, wherein the first semiconductor device has a third gate side wall insulating film made of the same material as that of the second side wall insulating film of the second semiconductor device on an etching stopper film side wall.

3. The semiconductor apparatus according to claim 1, wherein an interlayer insulating film is formed on the first region to cover the first semiconductor device, and the interlayer insulating film includes a contact with respect to the semiconductor substrate which is formed in alignment with an end of the etching stopper film.

4. A semiconductor apparatus comprising:
a semiconductor substrate having a first region and a second region isolated from the first region;
a first semiconductor device which is formed in the first region and which includes a first gate insulating film of a silicon oxide single film formed on the semiconductor substrate, and a first gate electrode formed on the first gate insulating film, and
a second semiconductor device which is formed in the second region and which includes a second gate insulating film of a single layer made of an insulating material of a dielectric constant different from that of the silicon oxide film, and a second gate electrode formed on the second gate insulating film,
wherein the first semiconductor device includes an etching stopper film which is formed to cover the first gate electrode and which is made of the same insulating material as that of the second gate insulating film.

5. The semiconductor apparatus according to claim 4, wherein an interlayer insulating film is formed on the first region to cover the first semiconductor device including the etching stopper film.

* * * * *